(12) United States Patent
Nishiyama et al.

(10) Patent No.: US 11,063,084 B2
(45) Date of Patent: Jul. 13, 2021

(54) METHOD FOR MANUFACTURING LIGHT-EMITTING ELEMENT

(71) Applicant: NICHIA CORPORATION, Anan (JP)

(72) Inventors: Hirofumi Nishiyama, Tokushima (JP); Seiichi Hayashi, Anan (JP); Toshinori Wada, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/797,166

(22) Filed: Feb. 21, 2020

(65) Prior Publication Data

US 2020/0273905 A1 Aug. 27, 2020

(30) Foreign Application Priority Data

Feb. 22, 2019 (JP) .............................. JP2019-030156

(51) Int. Cl.
*H01L 27/15* (2006.01)
*H01L 33/00* (2010.01)

(52) U.S. Cl.
CPC ............ *H01L 27/15* (2013.01); *H01L 33/007* (2013.01)

(58) Field of Classification Search
None
See application file for complete search history.

(56) References Cited

U.S. PATENT DOCUMENTS

2002/0146853 A1* 10/2002 Karpov ................... H01J 9/025
438/20
2005/0156175 A1 7/2005 Kim

FOREIGN PATENT DOCUMENTS

| JP | 2005-203792 A | 7/2005 |
| JP | 2006-156802 A | 6/2006 |
| JP | 2006-179546 A | 7/2006 |
| JP | 2009-070893 A | 4/2009 |

* cited by examiner

*Primary Examiner* — Robert K Carpenter
(74) *Attorney, Agent, or Firm* — Foley & Lardner LLP

(57) ABSTRACT

A method for manufacturing a light-emitting element comprises: forming a mask comprising a first film and a second film such that the mask covers a first active layer and a second nitride semiconductor layer, which comprises: forming the first film covering at least an upper surface of the second nitride semiconductor layer, and forming the second film covering the first film; while the first active layer and the second nitride semiconductor layer are covered with the mask, forming a third nitride semiconductor layer at an exposed portion of a first nitride semiconductor layer, wherein a temperature at which the third nitride semiconductor layer is formed is less than a melting point of the second film; and after the forming of the third nitride semiconductor layer, removing the mask, during which lift-off of the mask is performed by removing the first film, which also removes the second film.

16 Claims, 6 Drawing Sheets

US 11,063,084 B2

METHOD FOR MANUFACTURING LIGHT-EMITTING ELEMENT

CROSS-REFERENCE TO RELATED APPLICATION

This application claims priority to Japanese Patent Application No. 2019-030156, filed on Feb. 22, 2019, the disclosure of which is hereby incorporated by reference in its entirety.

BACKGROUND

The disclosure relates to a method for manufacturing a light-emitting element.

A light-emitting device is described in Japanese Patent Publication No. 2009-70893 and includes a substrate, a first active layer that emits green light and is disposed in a first region on the substrate, and a second active layer that emits blue light and is disposed in a second region adjacent to the first region on the substrate.

SUMMARY

The disclosure is directed a method for manufacturing a light-emitting element in which the crystallinity of a nitride semiconductor layer grown selectively using a mask is improved, and in which the removal of the mask is easy.

In certain embodiments of the disclosure, a method for manufacturing a light-emitting element includes exposing a portion of a first nitride semiconductor layer of a semiconductor stacked body from a first active layer and a second nitride semiconductor layer of the semiconductor stacked body by removing a portion of the second nitride semiconductor layer and a portion of the first active layer, the semiconductor stacked body including the first nitride semiconductor layer, the first active layer formed on the first nitride semiconductor layer, and the second nitride semiconductor layer formed on the first active layer, the first nitride semiconductor layer including a first conductive layer, the second nitride semiconductor layer including a second conductive layer; forming a mask covering the first active layer and the second nitride semiconductor layer; forming a third nitride semiconductor layer at the portion of the first nitride semiconductor layer in a state in which the first active layer and the second nitride semiconductor layer are covered with the mask; and removing the mask after the forming of the third nitride semiconductor layer. The mask includes a first film and a second film. The forming of the mask includes forming the first film covering at least an upper surface of the second nitride semiconductor layer, and forming the second film covering the first film. The second film has a melting point higher than a temperature of forming the third nitride semiconductor layer. In the removing of the mask, lift-off of the mask is performed by removing the second film by removing the first film.

According to a method for manufacturing a light-emitting element in the disclosure, the crystallinity of a nitride semiconductor layer grown selectively using a mask can be improved, and the removal of the mask can be easy.

DETAILED DESCRIPTION

Figure 1:
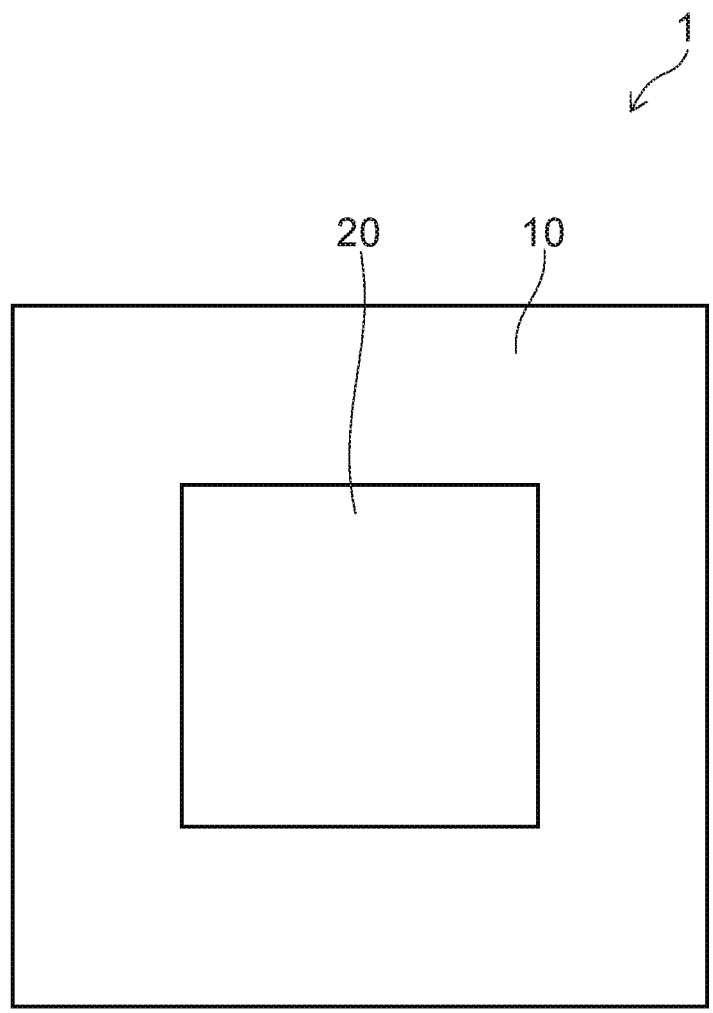
FIG. 1 is a schematic plan view showing an example of an arrangement relationship between a first stacked portion and a second stacked portion of a light-emitting element of certain embodiments of the present disclosure.

Embodiments will now be described with reference to the drawings. The same components in the drawings are marked with the same reference numerals.

FIG. 1 is a schematic plan view showing an example of the arrangement relationship between a first stacked portion 10 and a second stacked portion 20 of a light-emitting element 1 of certain embodiments of the disclosure.

The light-emitting element 1 includes a semiconductor stacked body made of a nitride semiconductor, and the semiconductor stacked body includes the first stacked portion 10 and the second stacked portion 20.

In the specification, "nitride semiconductor" includes all compositions of semiconductors of the chemical formula $In_xAl_yGa_{1-x-y}N$ ($0 \le x \le 1$, $0 \le y \le 1$, and $x+y \le 1$) for which the composition ratios x and y are changed within the respective changes. "nitride semiconductor" further includes group V elements other than N (nitrogen) in the chemical formula recited above, various elements added to control various properties such as the conductivity type, etc.

The first stacked portion 10 and the second stacked portion 20 are provided on the same substrate. Although an example is shown in FIG. 1 in which the first stacked portion 10 is disposed at the periphery of the second stacked portion 20, the arrangement relationship between the first stacked portion 10 and the second stacked portion 20 is not limited to the example.

The light emission peak wavelength of the first stacked portion 10 is different from the light emission peak wavelength of the second stacked portion 20. For example, the light emission peak wavelength of the first stacked portion 10 may be 430 nm or more and 480 nm or less, and blue light is emitted. For example, the light emission peak wavelength of the second stacked portion 20 may be 500 nm or more and 540 nm or less, and green light is emitted.

A method for manufacturing the light-emitting element 1 according to certain embodiments of the present disclosure will now be described. FIG. 2 to FIG. 11 are schematic cross-sectional views showing the method for manufacturing the light-emitting element 1.

Figure 2:
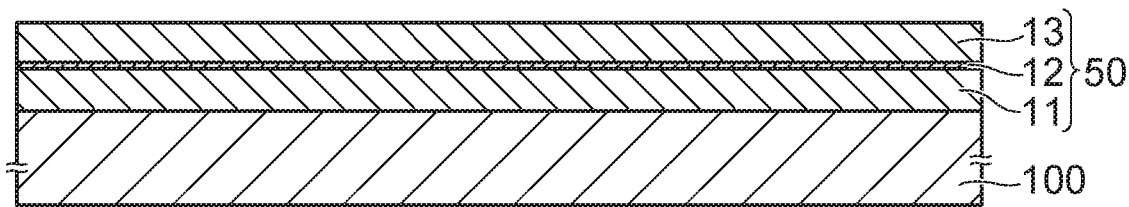
FIG. 2 to FIG. 11 are schematic cross-sectional views showing a method for manufacturing the light-emitting element of certain embodiments of the present disclosure.

As shown in FIG. 2, a semiconductor stacked body 50 is formed on a substrate 100. The semiconductor stacked body 50 includes a first nitride semiconductor layer 11, a first active layer 12, and a second nitride semiconductor layer 13. A first conductivity type refers to the conductivity type of one of an n-type or a p-type. A second conductivity type refers to the other conductivity type different from the first conductivity type. The first nitride semiconductor layer 11 may include, for example, an n-type semiconductor layer as a first conductive layer. The second nitride semiconductor layer 13 may include, for example, a p-type semiconductor layer as a second conductive layer. For example, the first active layer 12 may have a MQW (Multiple Quantum well) structure.

The substrate 100 may be, for example, a sapphire substrate. The first nitride semiconductor layer 11, the first active layer 12, and the second nitride semiconductor layer 13 may be epitaxially grown in order on the substrate 100 by, for example, MOCVD (metal organic chemical vapor deposition).

Figure 3:
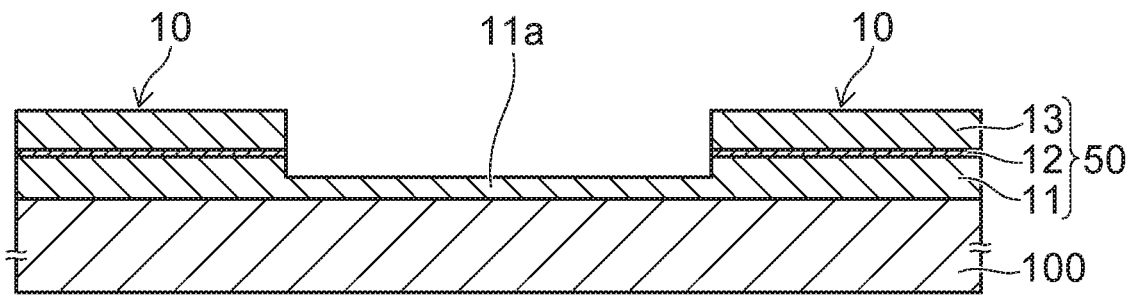

Then, a portion 11a of the first nitride semiconductor layer 11 is exposed from the first active layer 12 and the second nitride semiconductor layer 13 as shown in FIG. 3 by removing a portion of the second nitride semiconductor layer 13 and a portion of the first active layer 12 of the semiconductor stacked body 50. The portion of the second nitride semiconductor layer 13 and the portion of the first active layer 12 may be removed by, for example, RIE (Reactive Ion Etching) method using a resist mask.

The semiconductor stacked body 50 includes the first stacked portion 10, which includes the first nitride semiconductor layer 11, the first active layer 12, and the second nitride semiconductor layer 13, and further includes the portion where the portion 11a of the first nitride semiconductor layer 11 is exposed. The portion 11a of the first nitride semiconductor layer 11 is exposed from the first active layer 12 and the second nitride semiconductor layer 13 and is a portion of the first nitride semiconductor layer 11 where the first active layer 12 and the second nitride semiconductor layer 13 are not provided.

Then, a mask 17 that covers the first stacked portion 10 (shown in FIG. 7 described below) is formed. The process of forming the mask 17 includes a process of forming a first film 15 and a process of forming a second film 16.

Figure 4:
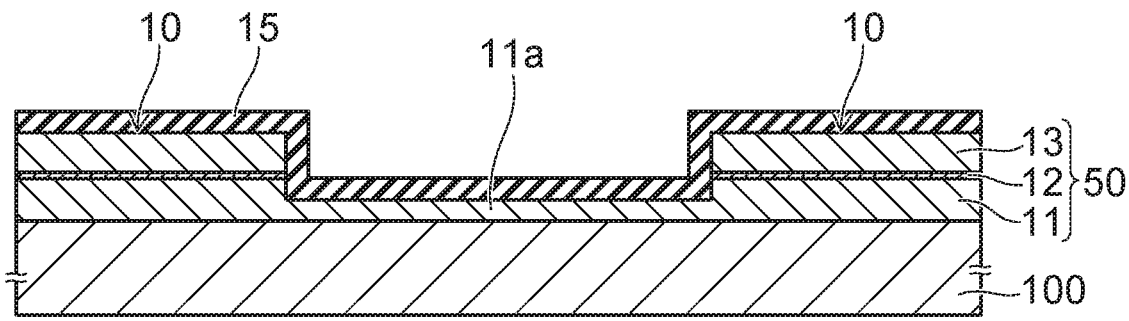

First, as shown in FIG. 4, the first film 15 is formed to cover the semiconductor stacked body 50. For example, a silicon oxide film (a $SiO_2$ film) may be formed by CVD (Chemical Vapor Deposition) method as the first film 15. The first film 15 covers the upper surface and the side surface of the first stacked portion 10 and the portion 11a of the first nitride semiconductor layer 11.

Figure 5:
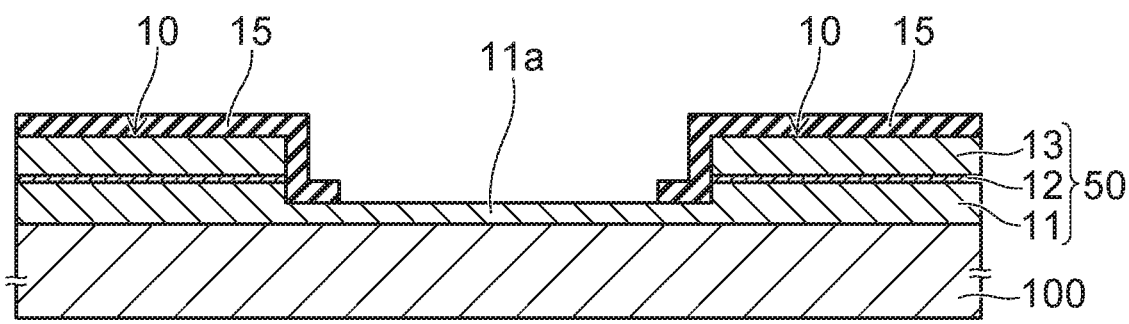

After the first film 15 is formed to cover the semiconductor stacked body 50, the portion 11a of the first nitride semiconductor layer 11 is exposed as shown in FIG. 5 by removing a portion of the first film 15 provided at the portion 11a of the first nitride semiconductor layer 11. For example, the portion of the first film 15 may be removed by RIE using a resist mask.

Figure 6:
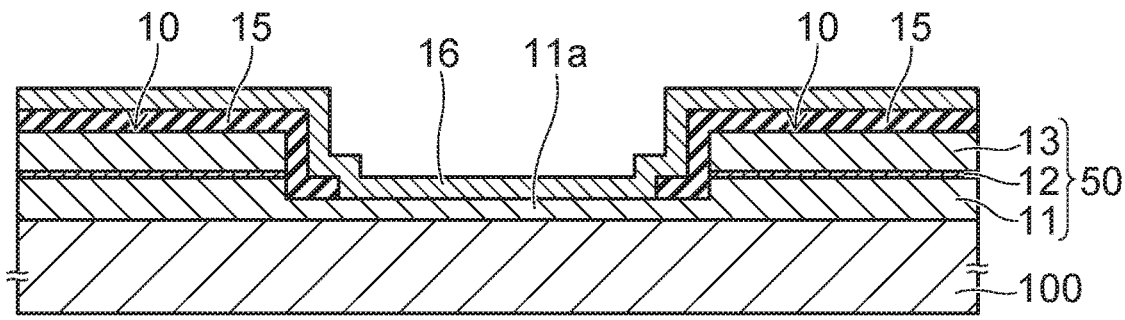
Figure 13:
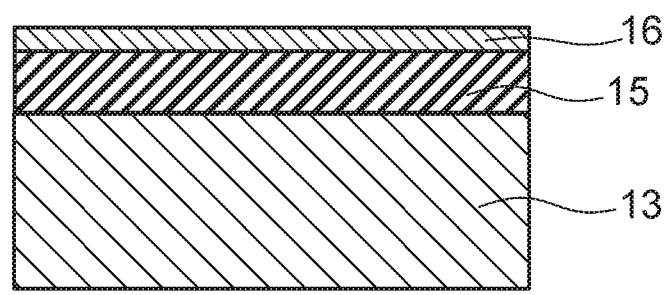
FIG. 13 is a schematic partially enlarged cross-sectional view of a portion of forming the first film 15 and the second film 16 showing a method for manufacturing the light emitting element of certain embodiments of the present disclosure.

Subsequently, as shown in FIG. 6, the second film 16 is formed on the first film 15. The second film 16 covers the upper surface and the side surface of the first film 15 and further covers the portion 11a of the first nitride semiconductor layer 11. For example, a tungsten film (a W film) may be formed as the second film 16 by sputtering method. As shown in the FIG. 13, the film thickness of the second film 16 is lower than the film thickness of the first film 15. For example, the film thickness of the first film 15 may be 150 nm or more and 300 nm or less. For example, the film thickness of the second film 16 may be 10 nm or more and 100 nm or less.

Figure 7:
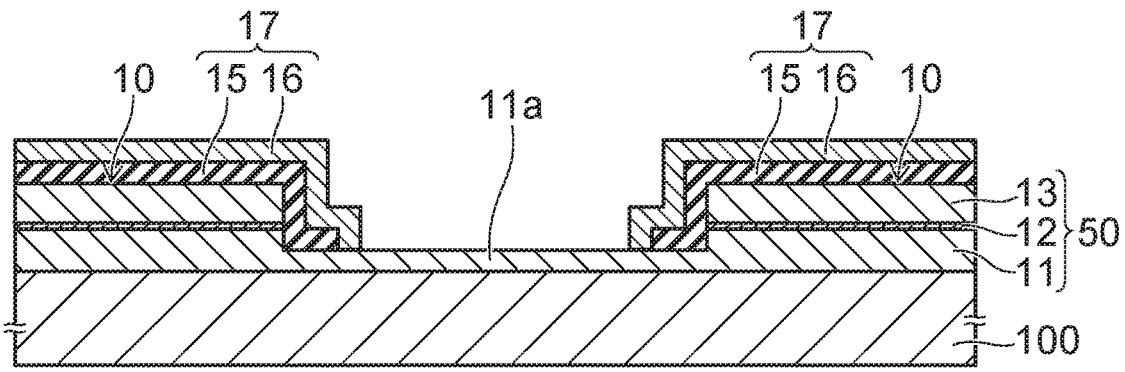

The portion 11a of the first nitride semiconductor layer 11 is exposed from the second film 16 as shown in FIG. 7 by removing a portion of the second film 16 provided at the portion 11a of the first nitride semiconductor layer 11. At this time, the second film 16 that covers the upper surface and the side surface of the first film 15 remains. For example, the portion of the second film 16 is removed by RIE using a resist mask.

Thus, the mask 17 that covers the upper surface and the side surface of the first stacked portion 10 is formed. The portion 11a of the first nitride semiconductor layer 11 is exposed from the mask 17.

Figure 8:
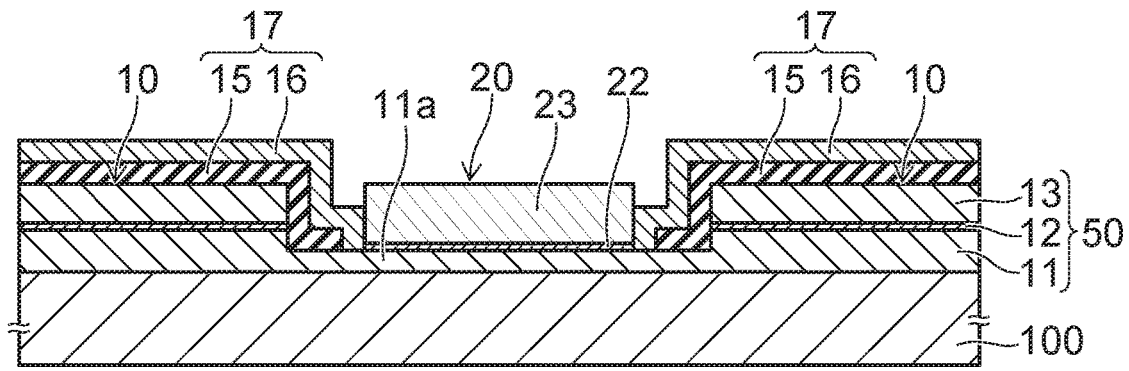

Thus, as shown in FIG. 8, a second active layer 22 and a third nitride semiconductor layer 23 are formed on the portion 11a of the first nitride semiconductor layer 11 exposed in a state in which the first stacked portion 10 is covered with the mask 17. The third nitride semiconductor layer 23 may include, for example, a p-type GaN layer as a second conductive layer. For example, the second active layer 22 may have a MQW structure. Surface processing such as etching or the like to the surface of the portion 11a of the first nitride semiconductor layer 11 may be performed before forming the second active layer 22 on the portion 11a of the first nitride semiconductor layer 11. Also, for example, an n-type semiconductor layer may be formed at the upper surface of the portion 11a of the first nitride semiconductor layer 11 before forming the second active layer 22 on the portion 11a of the first nitride semiconductor layer 11. Thereby, the crystallinity of the surface of the semiconductor layer where the second active layer 22 is formed may be improved further, and the crystallinity of the second active layer 22 may be improved.

The second active layer 22 and the third nitride semiconductor layer 23 are epitaxially grown in order on the portion 11a of the first nitride semiconductor layer 11 by, for example, MOCVD. For example, ammonia ($NH_3$) may be used as the source gas of nitrogen at this time.

For example, the second film 16 that is exposed at the outermost surface of the mask 17 may be a tungsten film, have a melting point higher than the reaction temperature (about 1000° C.) when forming the second active layer 22 and the third nitride semiconductor layer 23, and be resistant to ammonia. The mask 17 includes the first film 15 that is the lower layer and the second film 16 that is the upper layer; the second film 16 covers the first film 15; and the first film 15 is not exposed from the second film 16.

The mask 17 is removed by lift-off utilizing the first film 15 formed under the second film 16 after forming the second active layer 22 and the third nitride semiconductor layer 23.

Here, as a comparative example, defects such as pits, etc., occur easily in the second active layer 22 and the third nitride semiconductor layer 23 when the mask is only a silicon oxide film when forming the second active layer 22 and the third nitride semiconductor layer 23. It is considered that this is due to the effect of the oxygen included in the silicon oxide film when epitaxially growing the second active layer 22 and the third nitride semiconductor layer 23. That is, it is considered that the defects occur due to the oxygen included in the silicon oxide film being incorporated into the second active layer 22 and/or the third nitride semiconductor layer 23 in the epitaxial growth.

According to the embodiment, the first film 15, which is the silicon oxide film, is covered with the second film 16 and is not exposed when epitaxially growing the second active layer 22 and the third nitride semiconductor layer 23. This may suppress the effects on the semiconductor layer that occur due to the first film 15 described above being exposed from the second film 16. Therefore, the second active layer 22 and the third nitride semiconductor layer 23 that have excellent crystallinity may be formed on the first nitride semiconductor layer 11.

On the other hand, in the case of the mask made of only a tungsten film, anomalous growth of a nitride semiconductor layer on the tungsten film occurs easily when epitaxially growing the second active layer 22 and the third nitride semiconductor layer 23. Based on the analysis of foreign substances on the tungsten film performed by the inventors, foreign substances were found to be deposited, including the elemental components (Ga and N) of the second active layer 22 and the third nitride semiconductor layer 23, and it was difficult to remove the tungsten film on which the foreign substances were deposited.

According to the embodiment, even if the deposits are deposited on the second film 16 and the deposits and/or a portion of the second film 16 remain after the process of removing the second film 16, such matter is removed by lift-off with the first film 15 when removing the first film 15. Also, because the film thickness of the second film 16 is lower than the film thickness of the first film 15, the lift-off of the second film 16 can be easy.

In other words, according to the embodiment, the second active layer 22 and the third nitride semiconductor layer 23 are formed in the state in which the second film 16 is formed on the outermost surface of the mask 17 (the state in which the first film 15 is not exposed from the second film 16), and the mask 17 is removed by lift-off utilizing the first film 15 formed under the second film 16. By the method of forming the semiconductor layer using the mask 17 of the embodiment, pits occurring in the second active layer 22 and the third nitride semiconductor layer 23 can be reduced, and the mask 17 can be removed efficiently without degrading the crystallinity of the second active layer 22 and the third nitride semiconductor layer 23.

Figure 9:
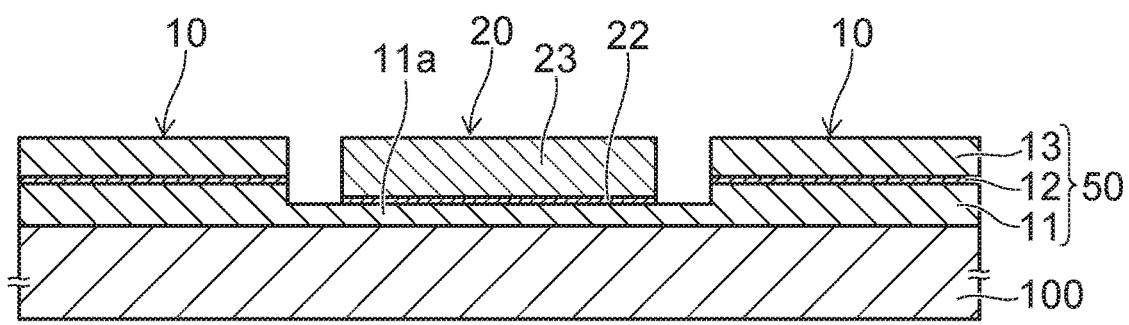

The mask 17 is removed, and the first stacked portion 10 that includes the first nitride semiconductor layer 11, the first active layer 12, and the second nitride semiconductor layer 13 and the second stacked portion 20 that includes the portion 11a of the first nitride semiconductor layer 11, the second active layer 22, and the third nitride semiconductor layer 23 are formed on the substrate 100 as shown in FIG. 9.

Figure 10:
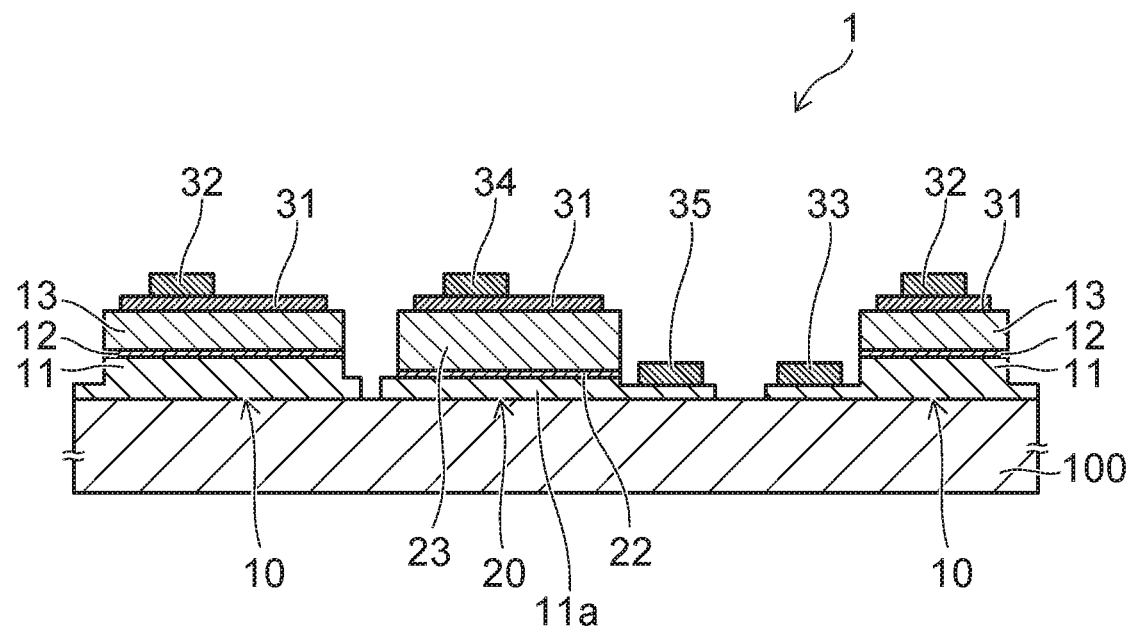

Subsequently, as shown in FIG. 10, a portion of the first nitride semiconductor layer 11 of the first stacked portion 10 is exposed by removing a portion of the second nitride semiconductor layer 13 and a portion of the first active layer 12 of the first stacked portion 10, and a first n-side electrode 33 is formed at the exposed portion of the first nitride semiconductor layer 11. Also, a portion of the first nitride semiconductor layer 11 of the second stacked portion 20 is exposed by removing a portion of the third nitride semiconductor layer 23 and a portion of the second active layer 22 of the second stacked portion 20, and a second n-side electrode 35 is formed at the exposed portion of the first nitride semiconductor layer 11. For example, a first p-side electrode 32 may be formed on the second nitride semiconductor layer 13 of the first stacked portion 10 with a transparent conductive film 31 of ITO (Indium Tin Oxide), etc., interposed. A second p-side electrode 34 is formed on the third nitride semiconductor layer 23 of the second stacked portion 20 with the transparent conductive film 31 interposed. The transparent conductive film 31 is formed in order to diffuse the current from the first p-side electrode 32 and the second p-side electrode 34 into a wide area of the second nitride semiconductor layer 13 and the third nitride semiconductor layer 23.

Figure 12:
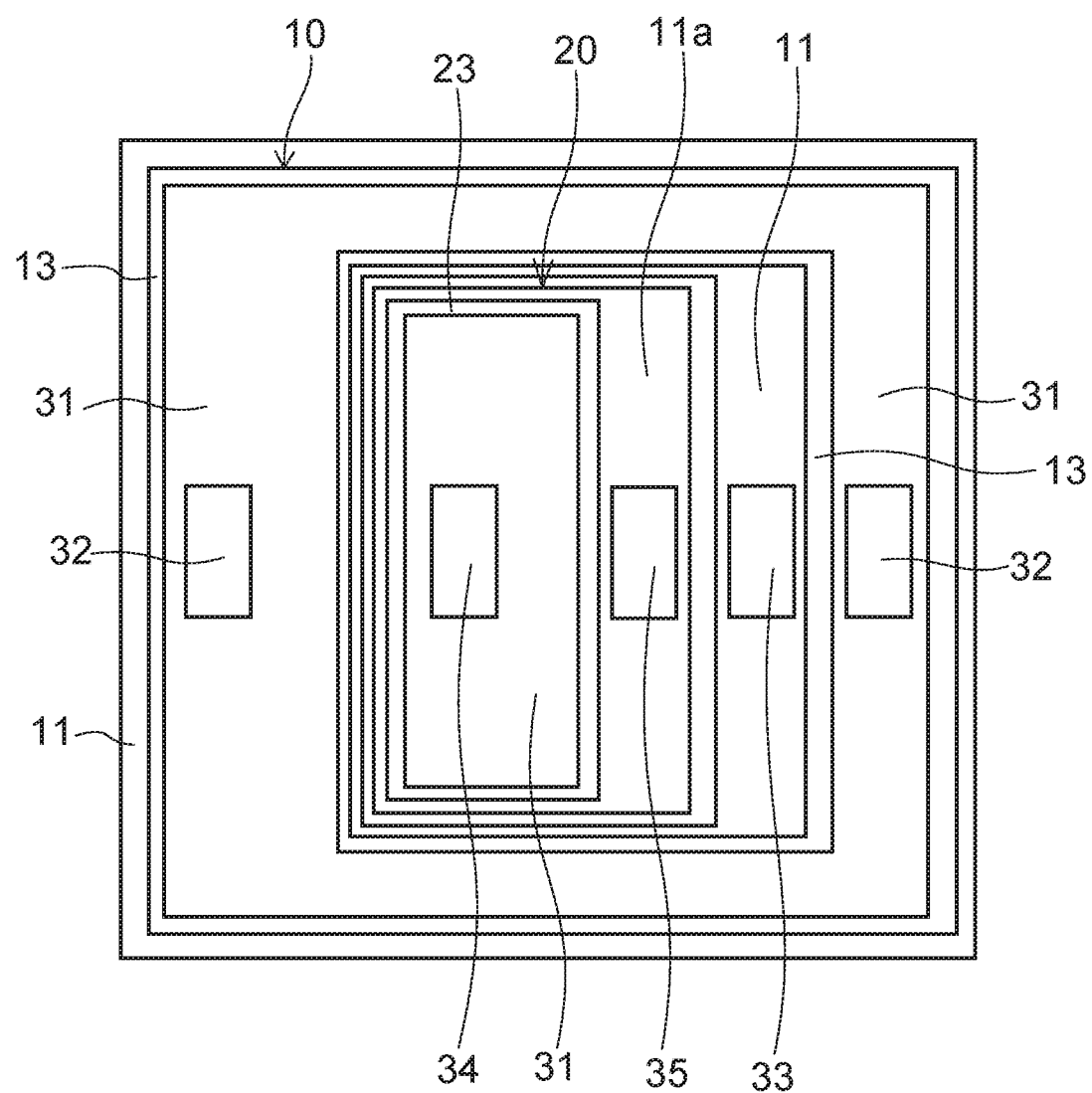
FIG. 12 is a schematic top view of the light-emitting element shown in FIG. 10.

FIG. 12 is a schematic top view of the light-emitting element shown in FIG. 10.

When viewed in top-view as shown in FIG. 12, the first stacked portion 10 is provided at the periphery of the second stacked portion 20. The transparent conductive film 31 that is provided at the upper surface of the second nitride semiconductor layer 13 is provided to be continuous to surround the periphery of the second stacked portion 20.

For example, the first stacked portion 10 and the second stacked portion 20 may be connected in series. Also, the first nitride semiconductor layer 11 of the first stacked portion 10 and the first nitride semiconductor layer 11 of the second stacked portion 20 may be separated by being partially removed to expose the substrate 100. Thereby, the first nitride semiconductor layer of the first stacked portion 10 and the first nitride semiconductor layer 11 of the second stacked portion 20 are in a state of not being electrically connected. By being in such a state, the first stacked portion 10 and the second stacked portion 20 can be connected to circuits of different systems and easily can have individual lighting control.

For example, the light emission peak wavelength of the first stacked portion 10 may be set to be different from the light emission peak wavelength of the second stacked portion 20 by setting the indium (In) composition ratio in the first active layer 12 to be different from the indium composition ratio in the second active layer 22. For example, the light emission peak wavelength of the second stacked portion 20 may be longer than the light emission peak wavelength of the first stacked portion 10 by setting the indium composition ratio in the second active layer 22 to be higher than the indium composition ratio in the first active layer 12. For example, the first stacked portion 10 may emit blue light, and the second stacked portion 20 may emit green light.

Thus, because stacked portions that emit light having light emission peak wavelengths that are different from each other can be formed on one substrate 100, the light-emitting element 1 can be reduced in size compared to a structure in which light-emitting elements each emitting different colors are separated from each other and housed in one package. Because the first stacked portion 10 and the second stacked portion 20 share the first nitride semiconductor layer 11, the distance between the first stacked portion 10 and the second stacked portion 20 can be reduced, and a reduction in size can be realized.

Figure 11:
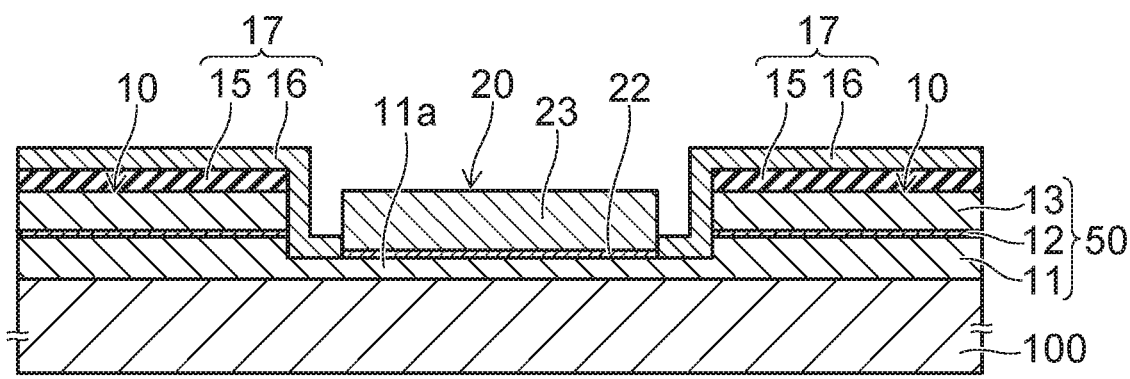

As shown in FIG. 11, the first film 15 of the mask 17 may not be formed on the side surface of the first stacked portion 10 and may be formed only on the upper surface of the first stacked portion 10, and the second film 16 may be formed to directly cover the upper surface and the side surface of the first film 15 and the side surface of the first stacked portion 10. Thereby, compared to the case where the first film 15 is formed to cover the side surface of the first stacked portion 10, the region where the portion 11a of the first nitride semiconductor layer 11 is exposed from the second film 16 can be increased. As a result, assuming that the portion 11a of the first nitride semiconductor layer 11 has an identical surface area, the surface area of the second stacked portion 20 formed on the portion 11a of the first nitride semiconductor layer 11 can become wider than that in the embodiment in which the first film 15 is formed on the side surface of the first stacked portion 10. In such a case, the output of the light-emitting element can be improved compared to that of the embodiment in which the first film 15 is formed on the side surface of the first stacked portion 10. Deposits are deposited less easily on the second film 16 covering the side surface of the first stacked portion 10 than on the second film 16 on the upper surface of the first stacked portion 10. Therefore, when removing the first film 15 by etching, the etching is less likely to be obstructed by the deposits.

Other than a silicon oxide film, for example, an aluminum oxide film may be used as the first film 15. In such a case, for example, the aluminum oxide film can be removed using BHF and/or phosphoric acid. Other than a W film, for example, a Ti film, a Ni film, a TiN film, a HfN film, a ZrN film, etc., may be used as the second film 16. Similarly to the W film, these metal films can be used favorably because these metal films are resistant to ammonia and have melting points higher than the reaction temperature (about 1000° C.) when forming the second active layer 22 and the third nitride semiconductor layer 23.

Embodiments of the present disclosure have been described with reference to specific examples. However, the present invention is not limited to these specific examples. Based on the above-described embodiments, all embodiments that can be implemented with appropriately design modification by one skilled in the art are also within the scope of the present invention as long as the gist of the present invention is included. Besides, within the scope of the spirit of the present invention, one skilled in the art can conceive various modifications, and such modifications fall within the scope of the present invention.

What is claimed is:

1. A method for manufacturing a light-emitting element, the method comprising:
    providing a semiconductor stacked body comprising:
        a first nitride semiconductor layer comprising a first conductive layer,
        a first active layer formed on the first nitride semiconductor layer, and
        a second nitride semiconductor layer formed on the first active layer, the second nitride semiconductor layer comprising a second conductive layer;
    exposing a portion of the first nitride semiconductor layer from the first active layer and the second nitride semiconductor layer by removing a portion of the second nitride semiconductor layer and a portion of the first active layer;
    forming a mask comprising a first film and a second film such that the mask covers the first active layer and the second nitride semiconductor layer, which comprises:
        forming the first film covering at least an upper surface of the second nitride semiconductor layer, and
        forming the second film covering the first film;
    while the first active layer and the second nitride semiconductor layer are covered with the mask, forming a third nitride semiconductor layer at the exposed portion of the first nitride semiconductor layer, wherein a temperature at which the third nitride semiconductor layer is formed is less than a melting point of the second film; and
    after the forming of the third nitride semiconductor layer, removing the mask, during which lift-off of the mask is performed by removing the first film, which also removes the second film.

2. The method according to claim 1, wherein:
a film thickness of the second film is lower than a film thickness of the first film.

3. The method according to claim 2, wherein:
a film thickness of first film is 150 nm or more and 300 nm or less, and
a film thickness of the second film is 10 nm or more and 100 nm or less.

4. The method according to claim 1, wherein:
the forming of the mask includes:
    forming the first film so as to cover an entire surface of the semiconductor stacked body, and subsequently exposing said portion of the first nitride semiconductor layer by removing a portion of the first film; and
    forming the second film covering the first film and said portion of the first nitride semiconductor layer, and subsequently exposing said portion of the first nitride semiconductor layer by removing a portion of the second film.

5. The method according to claim 1, wherein:
a light emission peak wavelength of a first stacked portion is different from a light emission peak wavelength of a second stacked portion,
the first stacked portion includes a first portion of the first nitride semiconductor layer, the second nitride semiconductor layer, and the first active layer formed between the first portion of the first nitride semiconductor layer and the second nitride semiconductor layer, and
the second stacked portion includes a second portion of the first nitride semiconductor layer, the third nitride semiconductor layer, and a second active layer formed between the second portion of first nitride semiconductor layer and the third nitride semiconductor layer.

6. The method according to claim 5, wherein:
the semiconductor stacked body comprises the first stacked portion and the second stacked portion that are connected in series.

7. The method according to claim 5, wherein:
a portion of the first nitride semiconductor layer forming part of the first stacked portion and a portion of the first nitride semiconductor layer forming a part of the second stacked portion are separated by the first nitride semiconductor layer being partially removed to expose the substrate.

8. The method according to claim 5, wherein:
an entirety of the first film is formed on an upper surface of the first stacked portion.

9. The method according to claim 7, wherein:
an entirety of the first film is formed on an upper surface of the first stacked portion.

10. The method according to claim 5, wherein:
the second film is formed to directly cover an upper surface and a side surface of the first film and a side surface of the first stacked portion.

11. The method according to claim 7, wherein:
the second film is formed to directly cover an upper surface and the side surface of the first film and the side surface of the first stacked portion.

12. The method according to claim 9, wherein
the second film is formed to directly cover the upper surface and a side surface of the first film and a side surface of the first stacked portion.

13. The method according to claim 12, wherein:
a total thickness of the first active layer and the first portion of the first nitride semiconductor layer is greater than a total thickness of the second active layer and the second portion of the first nitride semiconductor layer in a stacking direction.

14. The method according to claim 7, wherein:
the first film is made of a silicon oxide, and
the second film is made of a tungsten.

15. The method according to claim 10, wherein:
the first film is made of a silicon oxide, and
the second film is made of a tungsten.

16. The method according to claim 1, wherein:
the first film is made of a silicon oxide, and
the second film is made of a tungsten.

* * * * *